(12) United States Patent
Sanduleanu

(10) Patent No.: US 6,975,175 B2
(45) Date of Patent: Dec. 13, 2005

(54) CHARGE PUMP

(75) Inventor: Mihai Adrian Tiberiu Sanduleanu, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 443 days.

(21) Appl. No.: 10/218,229

(22) Filed: Aug. 13, 2002

(65) Prior Publication Data

US 2003/0034847 A1 Feb. 20, 2003

(30) Foreign Application Priority Data

Aug. 16, 2001 (EP) .............................. 01203125

(51) Int. Cl.⁷ .................................. H03L 7/00
(52) U.S. Cl. ................... 331/16; 331/1 A; 331/10; 375/376; 327/156; 327/157
(58) Field of Search ................. 331/1 A, 16, 10; 327/156, 157; 375/376

(56) References Cited

U.S. PATENT DOCUMENTS

| 5,483,194 A | 1/1996 | Genest | 330/253 |
| 5,945,855 A | * 8/1999 | Momtaz | 327/157 |
| 6,650,720 B1 | * 11/2003 | Grung et al. | 375/375 |

FOREIGN PATENT DOCUMENTS

| EP | 0856946 A2 | 8/1998 |
| GB | 001149950 | 1/1975 |
| WO | 0233819 A2 | 4/2002 |

OTHER PUBLICATIONS

010039736, Feb. 13, 1991, USA.

* cited by examiner

Primary Examiner—Arnold Kinkead
(74) Attorney, Agent, or Firm—Adam Stroud

(57) ABSTRACT

The present invention relates to a charge pump, in particular for use in a tuning system including a phase-locked loop, for generating currents, including a current amplifier, wherein the current amplifier includes a translinear circuit.

6 Claims, 3 Drawing Sheets

CHARGE PUMP

FIELD OF THE INVENTION

The present invention relates to a charge pump, in particular for use in a tuning system including a phase-locked loop, for generating currents, comprising current amplifier means.

A charge pump is used e.g. in tuning systems including a phase-locked loop (PLL) with large tuning range ("Sonet"/ "SDH" applications) wherein a preferable application is the Data and Clock Recovery (DCR) function. However, such a charge pump can be used in any type of tuning system mostly in relationship with a linear phase detector so that the above mentioned implementation does not impair the generality of the application of such a charge pump.

BACKGROUND OF THE INVENTION

In a PLL environment, a phase detector (PD) drives differentially the input of a differential charge pump. It can be of linear type or bang-bang type since the charge pump has to work in a linear mode. When using bang-bang phase detectors, the input pulses are rectangular signals and are linearly amplified by the differential charge pump.

EP 0 718 978 A1 discloses a differential charge pump comprising a lowpass filter network, two identical current generators for injecting the same current in a substantial continuous manner on two significant nodes of the lowpass filter and two pairs of identical, switchingly controlled current generators connected to said nodes, respectively, each capable of pulling a current. The two generators forming each of said two pairs are controlled by one of a pair of control signals and by the inverted signal of the other of said pair of control signals, respectively. All four switchingly controlled generators may be of the same type. The two current generators employed for continuously injecting the same current on the two nodes of the lowpass filter are controlled through a common feedback loop. The low pass filter network is chargeable and dischargeable by means of the switchingly controlled current generators.

From U.S. Pat. No. 6,111,470 A known is a PLL circuit with charge pump noise cancellation, wherein the switching time of the PLL circuit can be reduced by increasing circuit bandwidth. A charge pump is commonly used in the PLL circuit to drive a voltage control oscillator (VCO). The increase in bandwidth intensifies the noise which is contributed by the charge pump. To reduce such charge pump noise, a chopper stabilizer circuit modulates the noise to a sufficiently high frequency so that a low-pass filter filters out the modulated noise.

U.S. Pat. No. 5,485,125 discloses a phase-locked variable frequency oscillator arrangement including a voltage controlled oscillator (VCO) which is controlled by a control signal produced by charging or discharging of a capacitor in a charge pump circuit. The charge pump circuit includes current sources driven by up or down command signals from a phase detector which detects the phase of the VCO output. When the command signals are simultaneously active, a logic gate circuit supplies a reset pulse to the phase detector via a delay device which is adapted to the rise time of the current in the current sources. The delay device includes a transistor which forms a switched pair with one of the transistors forming the current sources. The reset signal is produced when the current of such transistor reaches a selected fraction of its normal current, after being turned on by the logic gate circuit.

Further PLL circuits including a charge pump in a similar manner as described above are disclosed in U.S. Pat. Nos. 5,534,823 A, 5,943,382 A and 5,113,152 A.

SUMMARY OF THE INVENTION

An object of the present invention is to provide a charge pump comprising current amplifier means having a good linearly amplification gain and performing also a direct current (DC) shift such that output transistors work optimally at zero collector-base voltage.

In order to achieve the above and other objects, according to the present invention, there is provided a charge pump, in particular for use in a tuning system including a phase-locked loop, for generating currents, comprising current amplifier means, characterized in that said current amplifier means comprises a translinear circuit.

The current amplifier means according to the present invention provides for a good linear amplification gain. When using bang-bang phase detectors in a PLL environment, the input pulses are rectangular signals which are linearly amplified by the charge pump. The advantage of using a current amplifier having a construction in accordance with the present invention at the input is twofold:

Firstly, the current levels of the phase detector in a PLL environment are not necessarily chosen optimal in order to achieve the best loop cutoff frequency. It allows more flexibility in scaling the current with a factor at wish. The output of the charge pump and a loop filter, if there is any, are isolated from the input and preferably facilitates a common mode control desired in a differential configuration.

Secondly, the current amplifier means performs also DC shift such that the output transistors work optimally at zero collector-base voltage.

Further advantageous embodiments are defined in the dependent claims.

In a preferred embodiment of the present invention, the translinear circuit comprises an input terminal, an output terminal, a first transistor with its base applied to a predetermined biasing voltage, its collector connected to supply voltage means and its emitter connected to said input terminal, a second transistor with its base connected to the base of said first transistor and its collector connected to said supply voltage means, a third transistor with its base connected to the emitter of said first transistor, its collector connected to the emitter of said second transistor and its emitter connected to said output terminal, and a fourth transistor with its base connected to the emitter of said second transistor, its collector connected to a current source means and its emitter connected to said output terminal. The transistors can be npn transistors, and said predetermined biasing voltage can be about half of the supply voltage generated by said supply voltage means.

The above and other objects and features of the present invention will become clear from the following description taken in conjunction with the preferred embodiment with reference to the accompanying drawings in which:

DETAILED DESCRIPTION OF THE PREFERRED EMBODIMENT

Figure 1:
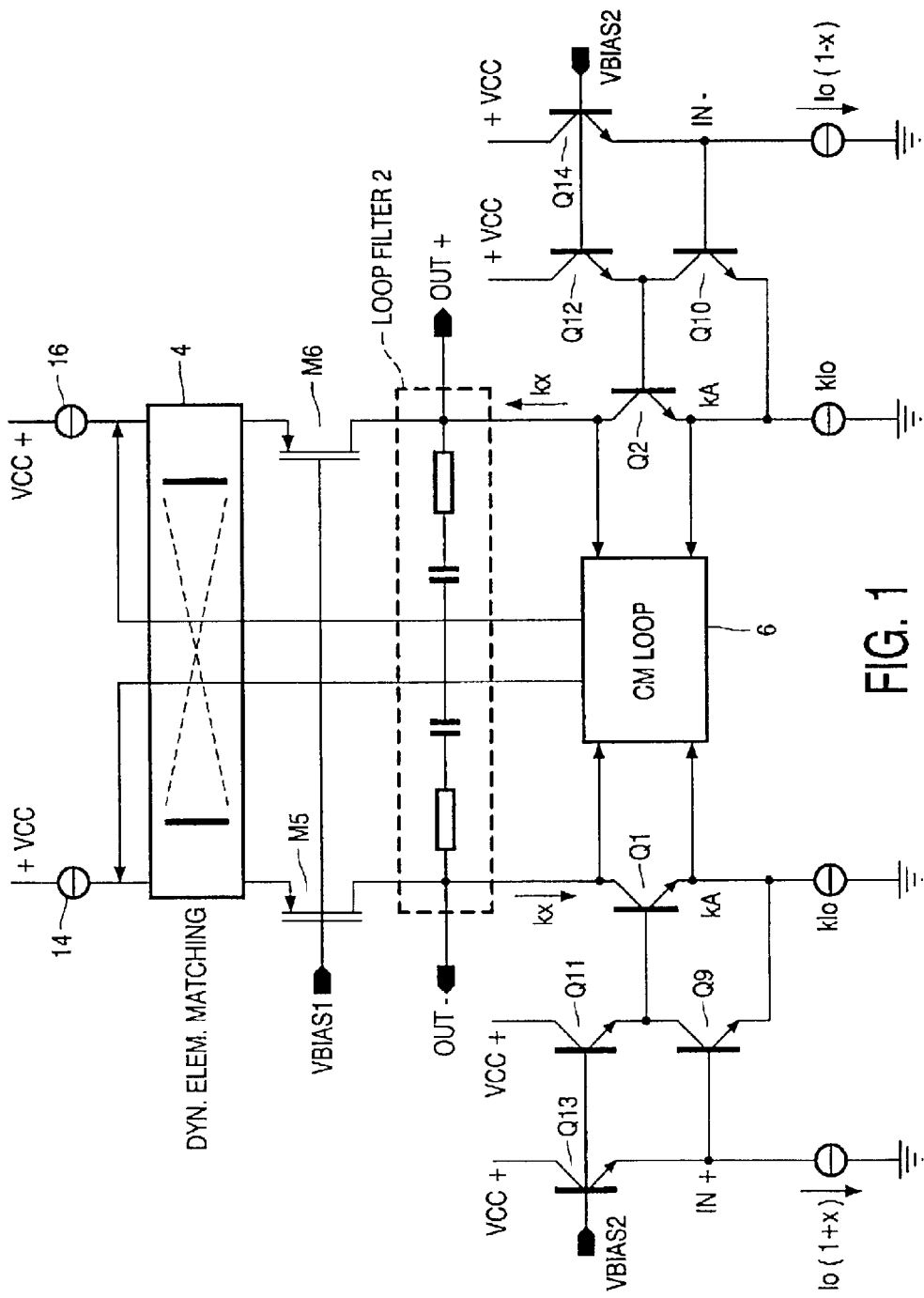
FIG. 1 is a principle circuit diagram of a differential charge pump in accordance with a preferred embodiment of the present invention.

In FIG. 1 shown is a principle circuit diagram of a preferred embodiment of a differential charge pump. The transistors Q13, Q11, Q9 and Q1 define a first current amplifier and level shifter, whereas the transistors Q14, Q12, Q10 and Q2 define a second current amplifier and level shifter. The bases of the transistors Q13 and Q14 are biased at a constant voltage VBIAS2 which is about half of the supply voltage VCC. A first node which connects the emitter of the transistor Q13 to a first current source Io (1+x) defines a first input IN+; and a second node which connects the emitter of the transistor Q14 to a second current source Io (1−x) defines an inverse second input IN−.

Q13, Q11, Q9, Q1 and Q14, Q12, Q10, Q2, respectively, are connected in a translinear loop. Given the fact that Q13 and Q14 are biased at the same base voltage which is the mentioned bias voltage VBIAS2, the base-emitter voltages of Q13, Q11, Q9, Q1 and of Q14, Q12, Q10, Q2, respectively, have the following relationship:

$$V_{BE13}+V_{BE9}=V_{BE11}+V_{BE1} \quad (1).$$

$$V_{BE14}+V_{BE10}=V_{BE12}+V_{BE2} \quad (2).$$

Further, the currents through the collectors of Q13, Q11, Q9, Q1 and of Q14, Q12, Q10, Q2, respectively, have the following relationship:

$$I_{C13} \times I_{C9}=I_{C11} \times I_{C1} \quad (3).$$

$$I_{C14} \times I_{C10}=I_{C12} \times I_{C2} \quad (4).$$

Since the currents of Q11 and Q9 are equal, the current of Q1 is a replica of the input current which can be scaled with the emitter size; and since the currents of Q12 and Q10 are equal, the current of Q2 is a replica of the inverse second input current which can be scaled with the emitter size. So, the input differential current Io(1+x) and Io(1−x) is copied and scaled in the collector of Q1 and Q2 with the factor k determined by Q1 and Q2, respectively.

PMOS transistors M5, M6 act as cascode transistors for enhancing the gain of the circuit isolating an output loop filter 2 from a dynamic element matching circuit 4. The output loop filter 2 is provided for the local filtering of spurious signals generated by switching effects in the dynamic element matching circuit 4.

Further provided is a common mode circuit 6 for keeping the common mode voltage at the differential output consisting of a first output OUT+ and an inverse second output OUT− at about half of the supply voltage VCC. The common mode circuit 6 measures the common mode voltage at the differential output and adjusts the netto current flow in the PMOS transistors M5, M6 until the DC current of the PMOS transistors M5, M6 equals the collector currents kIo of Q1 and Q2.

The output loop filter 2 is differentially applied at the first output OUT+ and the inverse second output OUT− and is preferably provided as lowpass filter filtering the differential output signal before applying it e.g. to a tuning port of a VCO.

The common mode voltage in the emitters of Q11 and Q12 which voltage is about VBIAS2−$V_{BE11}$ and VBIAS2−$V_{BE12}$, respectively, is sensed by the common mode circuit 6.

First and second common mode current sources 14 and 16 are provided for generating and additionally feeding common mode bias currents to the differential output OUT+/OUT−. The bias currents are chosen such that in steady state the output common mode voltage is about half of the supply voltage VCC, i.e. VCC/2.

When the common mode voltage at the differential output OUT+/OUT−deviates from its desired value (VCC/2), the variation is amplified by the common mode circuit 6, and the difference is subtracted from the bias currents generated by the first and second common mode current sources 14 and 16. The netto current flowing in the PMOS transistors M5 and M6 has a regulating effect on the common mode voltage correcting its deviation.

By choosing the voltage VBIAS2 such that the common mode voltage in the emitter of Q11 and Q12 is half of the supply voltage VCC, i.e. VCC/2, the output transistors Q1 and Q2 have a collector-base voltage of zero whereby the Early effect is minimized due to their finite output resistance.

The dynamic element matching circuit 4 has the role of reducing the 1/f noise of the netto current flowing through M5 and M6 and, at the same time, reducing the offset of it. When the transposition of signals in the dynamic element matching circuit 4 happens at a frequency far beyond the cut of frequency of the loop filter 2, the spurious signals from the dynamic element matching circuit 4 are filtered out by the loop filter 2.

In case any offset voltage at the differential output of the differential charge-pump acts as a static error in a PLL configuration, its effect is a drift in the VCO frequency. When burst type of signals are applied to the phase-detector of the PLL, the inactivity between two bursts translates into a frequency drift of the VCO. Therefore the PLL has to start again the frequency acquisition process which can cost extra time. The effect of the dynamic element matching circuit is clearly benefic in such situation. Less 1/f noise means also less residual phase-noise at the output of the PLL.

The differential implementation is robust towards common-mode noise and noise coming from substrate and power supply. It allows double swing at the output with the effect of reducing the gain constant of the VCO which again helps in reducing the residual phase-noise of the PLL.

The advent of fiber optic communications has brought fully integrated optical receivers in which low-power becomes a must in order to cope with higher integration densities and the limited thermal capabilities of existing packages. At the receiver side, data and clock recovery units (DCR), usually PLL based, are needed to recover the clock information and to retime the incoming data.

Figure 2:
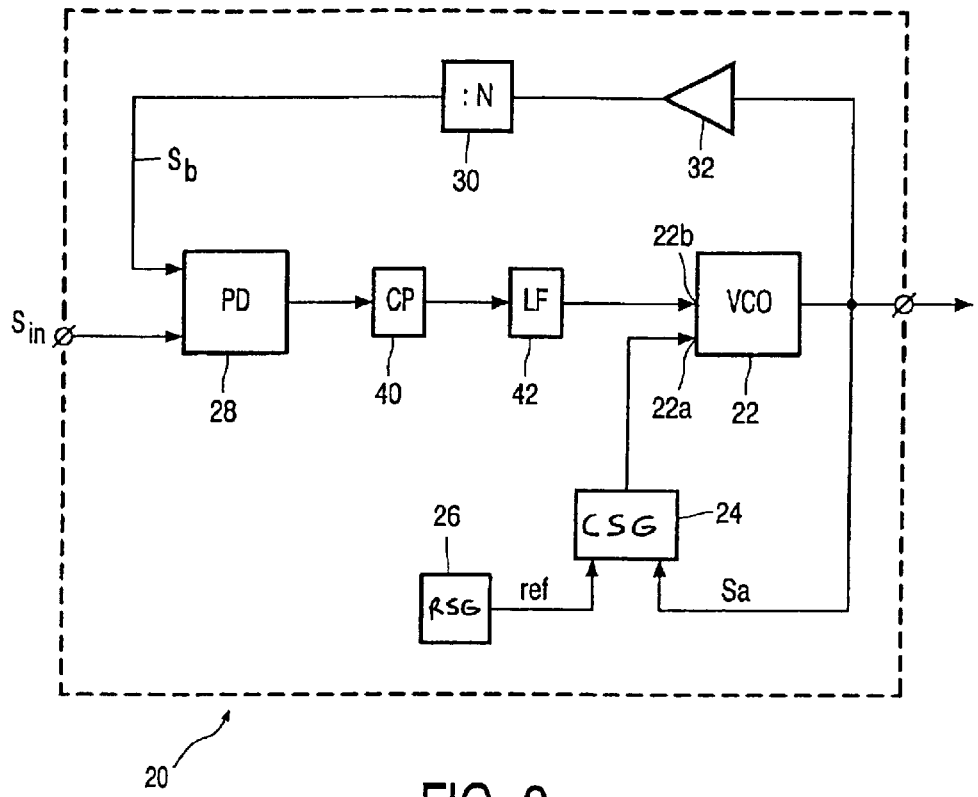
FIG. 2 a preferred embodiment of a clock recovery circuit including the charge pump.

FIG. 2 shows a preferred embodiment of a clock recovery circuit 20 which comprises a voltage controllable oscillator 22. The controllable oscillator 22 is part of a frequency locked loop further including the control signal generator 24. The controllable oscillator 22 has a coarse tuning port 22a which is coupled to the control signal generator 24. The control signal generator 24 receives a reference signal Sref from a reference signal generator 26, such as a crystal. The controllable oscillator 22 also forms part of a phase locked loop which comprises a phase detector 28 for generating a phase difference signal Sd which is indicative for a phase difference between an input signal Sin and a feedback signal Sb. The feedback signal Sb is obtained by a frequency divider 30 from the output signal of the controllable oscillator 22. Further, the clock recovery circuit 20 of FIG. 3 includes a charge pump 40 which receives the output signal from the phase detector 28 at its input and is connected with its output to a low-pass-filter 42 whose output is coupled to a fine tuning port 22b of the controllable oscillator 22.

Figure 3:
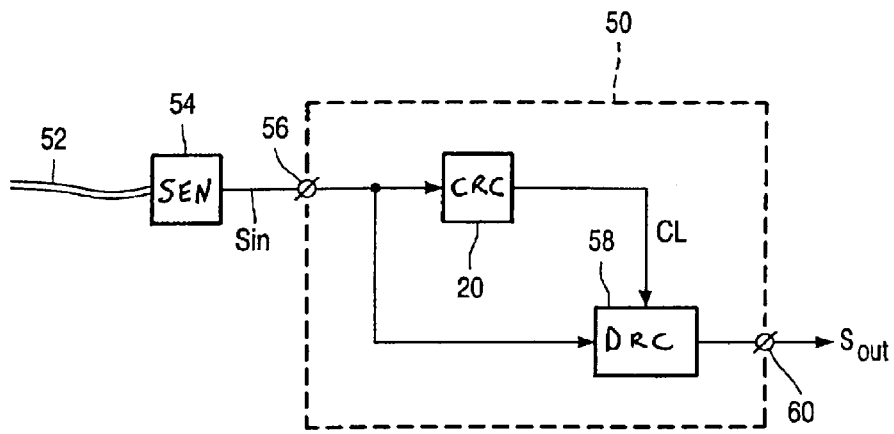
FIG. 3 a preferred embodiment of a receiver for a fiber-optic channel including the clock recovery circuit of FIG. 2.

FIG. 3 shows a preferred embodiment of a receiver 50 for a fibre-optic channel 52. The receiver 50 comprises an input 56 for receiving an input signal Sin from a sensor 54 which is coupled to the fibre-optic channel 52. The receiver 50 of FIG. 3 further includes the clock recovery circuit 20 of FIG. 2 which is coupled to the input 56 for receiving the input signal Sin as reference signal. A data recovery circuit 58 is coupled to the clock recovery circuit 20 and to the input 56 and comprises an output 60 which generates a digital output signal Sout in response to the input signal Sin.

Figure 4:
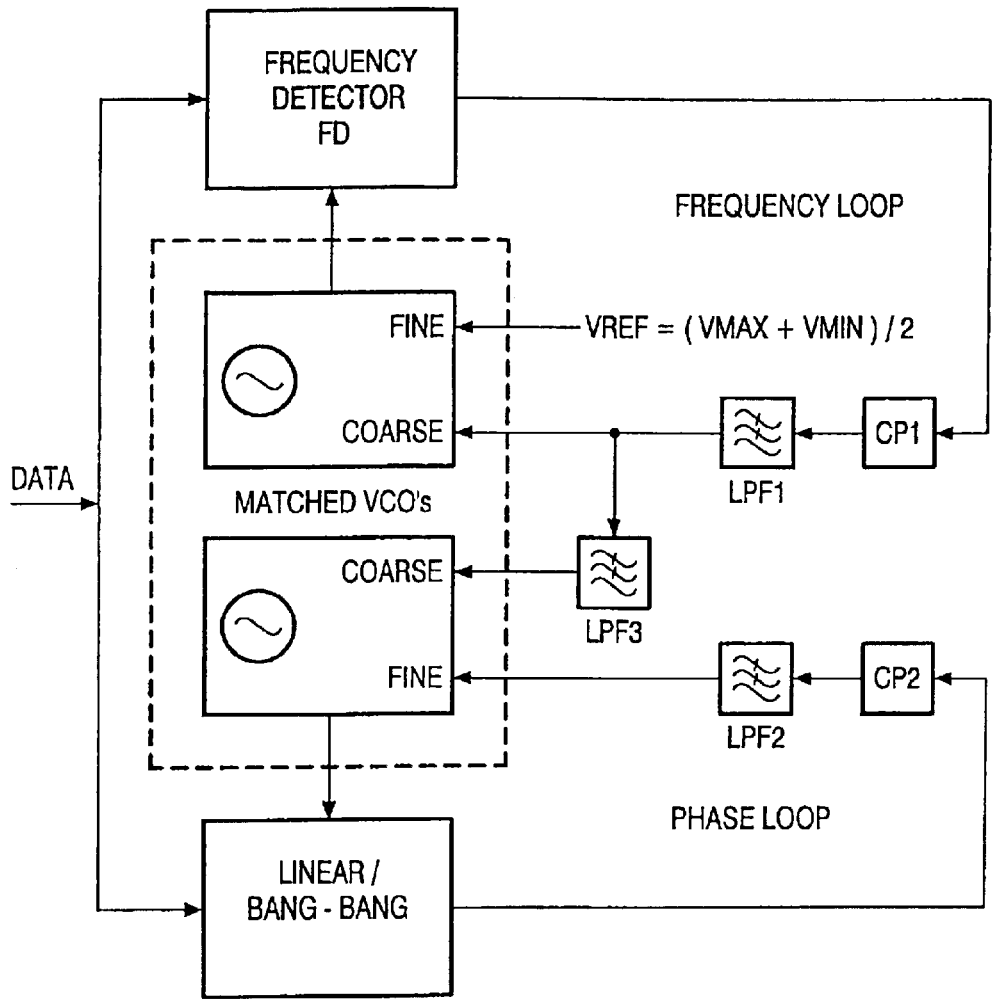
FIG. 4 a further preferred embodiment of a data and clock recovery unit including charge pumps.

FIG. 4 shows a further preferred embodiment of a data and clock recovery unit comprising a frequency locked loop and a phase locked loop. The data and clock recovery unit of FIG. 4 comprises matched voltage-controllable oscillators wherein the one controllable oscillator is part of the frequency loop and the other controllable oscillator is part of the phase locked loop. Further, the data and clock recovery unit of FIG. 4 comprises two charge pumps wherein the one charge pump CP1 is included in the frequency locked loop and the other charge pump CP2 is included in the phase locked loop. Moreover, the data and clock recovery unit of FIG. 4 comprises low-pass filters wherein the one low-pass filter LPF1 is included in the frequency locked loop and the other low-pass filter LPF2 is included in the phase locked loop.

It should be noted here that the low-pass filter 42 of the clock recovery circuit of FIG. 2 and the low-pass filters LPF1 and LPF2 of the data and clock recovery unit of FIG. 4 are the low-pass filters as already shown in the implementation of the charge pump as described above in relation to FIG. 1.

What is claimed is:

1. Charge pump for generating currents, comprising current amplifier means, wherein said current amplifier means comprises a translinear circuit; and wherein said translinear circuit comprises
   an input terminal,
   an output terminal,
   a first transistor with its base applied to a predetermined biasing voltage, its collector connected to supply voltage means and its emitter connected to said input terminal,
   a second transistor with its base connected to the base of said first transistor and its collector connected to said supply voltage means,
   a third transistor with its base connected to the emitter of said first transistor, its collector connected to the emitter of said second transistor and its emitter connected to a current source, and
   a fourth transistor with its base connected to the emitter of said second transistor, its collector connected to said output terminal, and its emitter connected to said current source.

2. Charge pump in accordance with claim 1,
   wherein
   said transistors are npn transistors.

3. Charge pump in accordance with claim 1,
   wherein said predetermined biasing voltage is about half of the supply
   voltage generated by said supply voltage means.

4. Clock recovery circuit comprising a charge pump in accordance with claim 1.

5. Clock recovery circuit according to claim 4, comprising a controllable oscillator means which both is part of a frequency locked loop and of a phase locked loop.

6. A receiver for a fibre-optic channel comprising
   an input for receiving an input signal from a sensor which is coupled to the fibre-optic channel,
   a clock recovery circuit coupled to the input for receiving said input signal as a reference signal, wherein the clock recovery circuit comprises the charge pump of claim 1,
   a data recovery circuit coupled to said clock recovery circuit and the input, for generating a digital output signal in response to the input signal, and an output signal of the clock recovery circuit, and
   an output for providing the digital output signal.

* * * * *